(12) United States Patent
Min et al.

(10) Patent No.: US 11,862,571 B2
(45) Date of Patent: Jan. 2, 2024

(54) SEMICONDUCTOR PACKAGE

(71) Applicant: SAMSUNG ELECTRONICS CO., LTD., Suwon-si (KR)

(72) Inventors: Byoung-Gug Min, Suwon-si (KR); Younhee Kang, Suwon-si (KR); Min-Woo Song, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/693,545

(22) Filed: Mar. 14, 2022

(65) Prior Publication Data

US 2022/0199549 A1 Jun. 23, 2022

Related U.S. Application Data

(63) Continuation of application No. 16/668,289, filed on Oct. 30, 2019, now Pat. No. 11,296,037.

(30) Foreign Application Priority Data

Apr. 1, 2019 (KR) ........................ 10-2019-0037898

(51) Int. Cl.
*H01L 23/552* (2006.01)
*H01L 23/498* (2006.01)
*H01L 25/00* (2006.01)

(52) U.S. Cl.
CPC .......... *H01L 23/552* (2013.01); *H01L 23/498* (2013.01); *H01L 25/00* (2013.01)

(58) Field of Classification Search
CPC ..... H01L 23/552; H01L 23/498; H01L 25/00; H01L 25/105; H01L 23/3128; H01L 2224/13; H01L 2224/18; H01L 2224/32145; H01L 2224/32225; H01L 2224/48091; H01L 2224/48227; H01L 2224/73265; H01L 2225/1023; H01L 2225/1041; H01L 2225/1058; H01L 2225/1088; H01L 23/3135; H01L 23/49822; H01L 23/49833; H01L 23/49816; H01L 23/5389; H01L 23/60;
(Continued)

(56) References Cited

U.S. PATENT DOCUMENTS 7,700,411 B2 4/2010 Yang et al.
8,502,367 B2 8/2013 Luan
(Continued)

FOREIGN PATENT DOCUMENTS

CN 102487059 6/2012
CN 107507823 12/2017
(Continued)

*Primary Examiner* — Shahed Ahmed
*Assistant Examiner* — Khatib A Rahman
(74) *Attorney, Agent, or Firm* — Lee IP Law, P.C.

(57) ABSTRACT

A semiconductor package including a first semiconductor chip having an upper surface, a lower surface that is opposite to the upper surface, and a sidewall between the upper surface and the lower surface; a capping insulation layer covering the upper surface and the sidewall of the first semiconductor chip; and a shielding layer on the capping insulation layer, wherein a lower portion of the capping insulation layer includes a laterally protruding capping protrusion contacting a lower surface of the shielding layer.

20 Claims, 12 Drawing Sheets

(58) Field of Classification Search
CPC ..... H01L 23/13; H01L 23/291; H01L 23/293; H01L 23/481; H01L 23/485; H01L 23/525; H01L 25/0657; H01L 2224/04105; H01L 2224/12105
See application file for complete search history.

(56) References Cited

U.S. PATENT DOCUMENTS

| | | | |
|---|---|---|---|
| 8,664,751 B2 | 3/2014 | Kim et al. | |
| 8,791,554 B2 | 7/2014 | Kwak et al. | |
| 8,872,319 B2 | 10/2014 | Kim et al. | |
| 8,946,886 B1 * | 2/2015 | Fuentes | H01L 23/3677 257/710 |
| 9,179,537 B2 | 11/2015 | Rappoport | |
| 9,362,209 B1 | 6/2016 | Mangrum | |
| 9,537,068 B2 | 1/2017 | Yang et al. | |
| 9,831,197 B1 | 11/2017 | Yeh et al. | |
| 9,887,164 B2 | 2/2018 | Choi et al. | |
| 10,104,763 B2 | 10/2018 | Lee et al. | |
| 10,177,096 B2 | 1/2019 | Min et al. | |
| 10,497,650 B2 | 12/2019 | Kim et al. | |
| 10,622,340 B2 | 4/2020 | Jeong et al. | |
| 10,629,519 B2 | 4/2020 | Chen et al. | |
| 10,879,187 B2 | 12/2020 | Suk et al. | |
| 2005/0141195 A1 * | 6/2005 | Pokharna | H01L 23/427 257/E23.098 |
| 2012/0119346 A1 | 5/2012 | Im et al. | |
| 2013/0020685 A1 * | 1/2013 | Kwak | H01L 23/552 257/659 |
| 2013/0082368 A1 | 4/2013 | Kim et al. | |
| 2015/0380361 A1 | 12/2015 | Lee | |
| 2016/0118337 A1 | 4/2016 | Yoon et al. | |
| 2016/0276288 A1 | 9/2016 | Lee et al. | |
| 2017/0110383 A1 | 4/2017 | Huang et al. | |
| 2017/0221859 A1 * | 8/2017 | Chen | H01L 21/78 |
| 2017/0278804 A1 | 9/2017 | Kawabata et al. | |
| 2017/0330839 A1 | 11/2017 | Kim et al. | |
| 2018/0226358 A1 | 8/2018 | Dias et al. | |
| 2019/0013299 A1 * | 1/2019 | Lee | H01L 25/105 |
| 2019/0304927 A1 * | 10/2019 | Kim | H01L 24/48 |
| 2019/0371700 A1 * | 12/2019 | Yeh | H01L 23/3737 |
| 2020/0243588 A1 | 7/2020 | Wang et al. | |
| 2021/0035917 A1 * | 2/2021 | Fay | H01L 23/3107 |

FOREIGN PATENT DOCUMENTS

| | | |
|---|---|---|
| CN | 108091615 | 5/2018 |
| CN | 108122862 | 6/2018 |
| CN | 108735717 | 11/2018 |
| CN | 109087867 | 12/2018 |
| CN | 109216294 | 1/2019 |
| JP | 2017-536693 A | 12/2017 |
| KR | 2012-0053332 A | 5/2012 |

* cited by examiner

SEMICONDUCTOR PACKAGE

CROSS-REFERENCE TO RELATED APPLICATIONS

This is a continuation application based on pending application Ser. No. 16/668,289, filed Oct. 30, 2019, the entire contents of which is hereby incorporated by reference.

Korean Patent Application No. 10-2019-0037898, filed on Apr. 1, 2019, in the Korean Intellectual Property Office, and entitled: "Semiconductor Package," is incorporated by reference herein in its entirety.

BACKGROUND

1. Field

Example embodiments of the present disclosure relate to a semiconductor package.

2. Description of the Related Art

A semiconductor package may be implemented in the form that an integrated circuit device is suitable for use in an electronic device. For example, the semiconductor package may have a structure in which a semiconductor chip is mounted on a printed circuit board (PCB) and a bonding wire and/or a bump electrically connect the semiconductor chip and the PCB.

SUMMARY

The embodiments may be realized by providing a semiconductor package including a first semiconductor chip having an upper surface, a lower surface that is opposite to the upper surface, and a sidewall between the upper surface and the lower surface; a capping insulation layer covering the upper surface and the sidewall of the first semiconductor chip; and a shielding layer on the capping insulation layer, wherein a lower portion of the capping insulation layer includes a laterally protruding capping protrusion contacting a lower surface of the shielding layer.

The embodiments may be realized by providing a semiconductor package including a first semiconductor chip having an upper surface, a lower surface that is opposite to the upper surface, and a sidewall between the upper surface and the lower surface; and a capping insulation layer covering the upper surface and the sidewall of the first semiconductor chip, wherein the capping insulation layer has a first capping sidewall and a second capping sidewall below the first capping sidewall such that the second capping sidewall is adjacent to the lower surface of the first semiconductor chip, and a surface roughness of the second capping sidewall is greater than a surface roughness of the first capping sidewall.

The embodiments may be realized by providing a semiconductor package including a first semiconductor chip having an upper surface, a lower surface that is opposite to the upper surface, and a sidewall between the upper surface and the lower surface; a capping insulation layer on the upper surface and the sidewall of the first semiconductor chip; and a shielding layer on the capping insulation layer, wherein a lower outer sidewall of the capping insulation layer is vertically aligned to a lower outer sidewall of the shielding layer.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
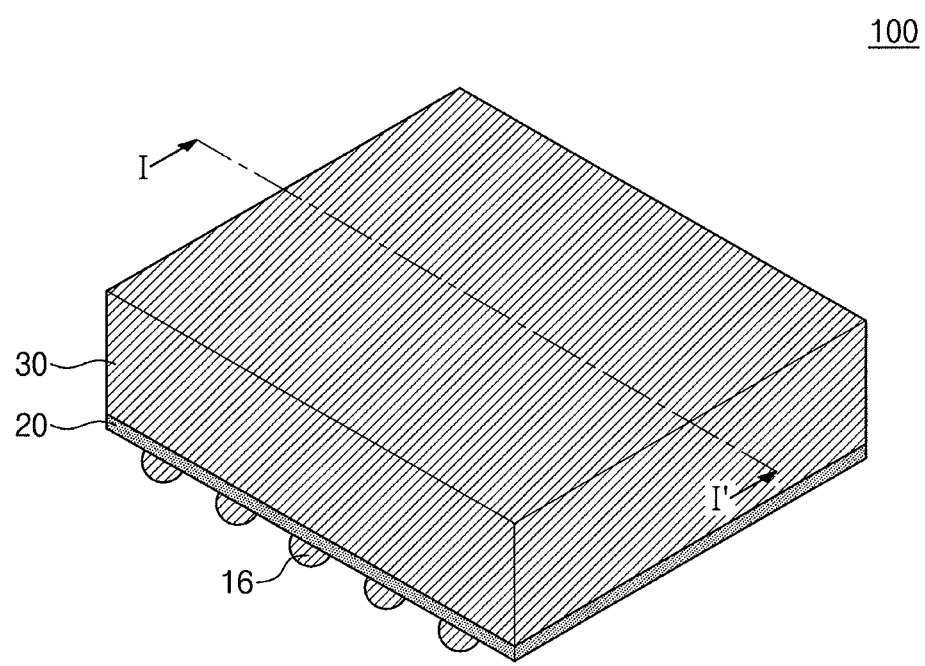
FIG. 1 illustrates a perspective view of a semiconductor package according to example embodiments.
Figure 2A:
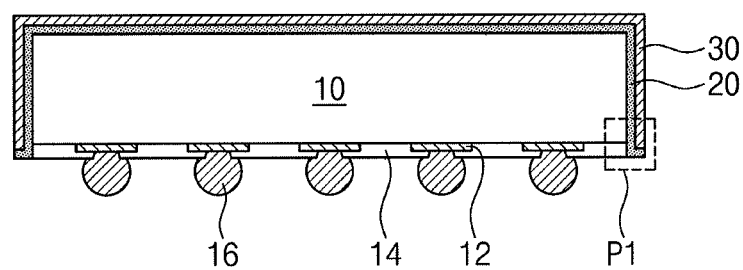
FIG. 2A illustrates a cross-sectional view taken along line I-I' of FIG. 1.
Figure 2B:
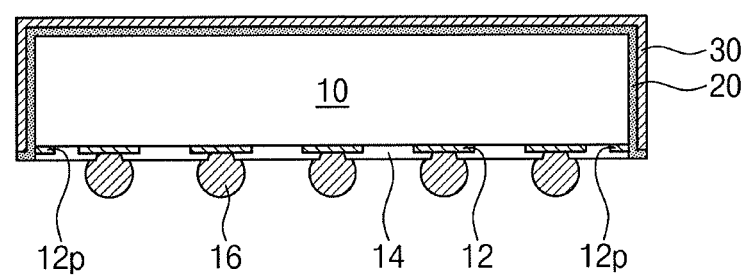
FIG. 2B illustrates a cross-sectional view of a semiconductor package according to example embodiments.
Figure 3A:
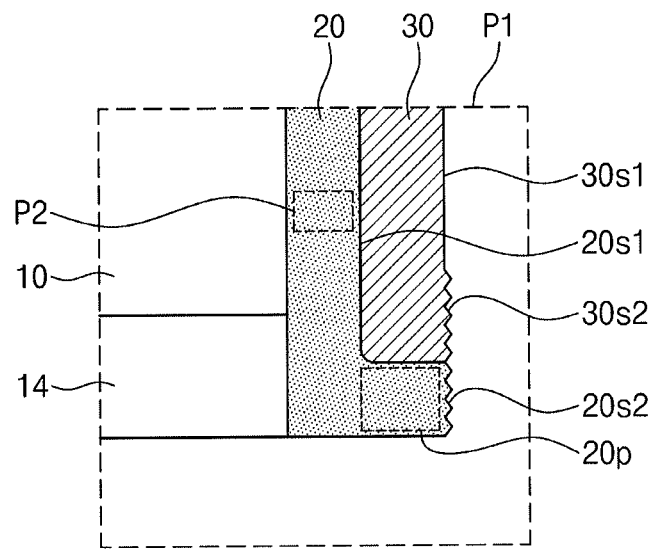
FIGS. 3A, 3B, and 3C illustrate enlarged views of portion 'P1' of FIG. 2A.
Figure 3B:
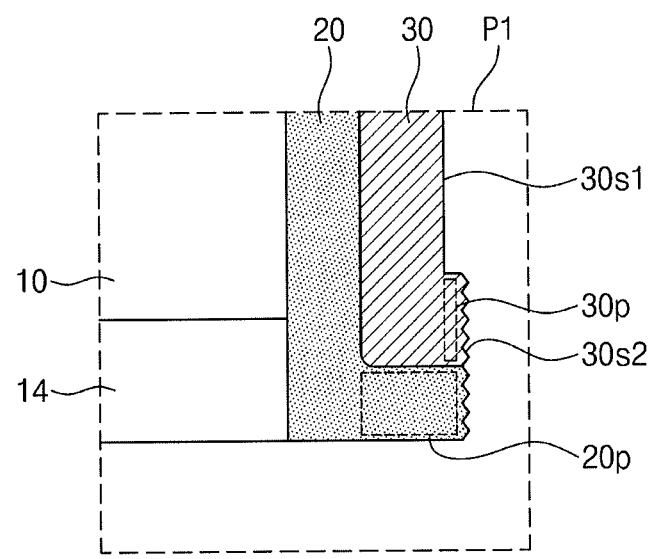
Figure 3C:
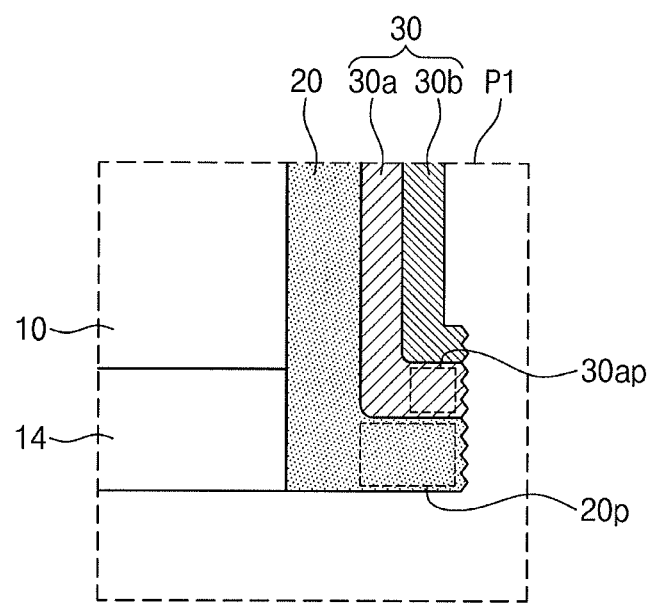
Figure 4:
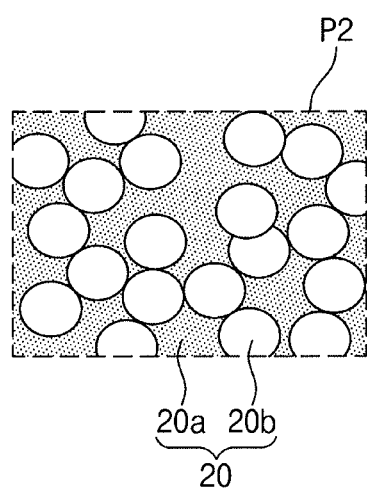
FIG. 4 illustrates an enlarged view of portion 'P2' of FIG. 3A.

FIG. 1 illustrates a perspective view of a semiconductor package according to example embodiments. FIG. 2A illustrates a cross-sectional view taken along line I-I' of FIG. 1. FIG. 2B illustrates a cross-sectional view of a semiconductor package according to example embodiments. FIGS. 3A, 3B, and 3C illustrate enlarged views of portion 'P1' of FIG. 2A. FIG. 4 illustrates an enlarged view of portion 'P2' of FIG. 3A.

Referring to FIGS. 1 and 2A, a semiconductor package 100 according to example embodiment may include a semiconductor chip 10. The semiconductor chip 10 may include, e.g., a system large scale integration (LSI), a logic circuit, an image sensor, such as CMOS image sensor (CIS), a memory device, such as a flash memory, a DRAM, an SRAM, an EEPROM, a PRAM, an MRAM, an ReRAM, a high bandwidth memory (HBM), or a hybrid memory cubic (HMC), or a microelectromechanical system (MEMS). As used herein, the term "or" is not an exclusive term, e.g., "A or B" could include A, B, or A and B.

Referring to FIG. 2A, a chip protection layer 14 may cover a (e.g., lower) surface of the semiconductor chip 10. The chip protection layer 14 may be formed of an insulating material, e.g., silicon nitride or polyimide. Chip conductive patterns 12 spaced apart from each other may be between the lower surface of the semiconductor chip 10 and the chip protection layer 14. The chip conductive patterns 12 may include, e.g., aluminum, copper, gold, tin, or titanium nitride. Each of the chip conductive patterns 12 may be formed of a single layer or multiple layers. External connection terminals 16 may pass through the chip protection layer 14 to be connected to the chip conductive patterns 12, respectively. The external connection terminals 16 may each include, e.g., a conductive bump, a conductive pillar, a solder layer, or a solder ball.

Referring to FIGS. 1 and 2A, a capping insulation layer 20 may cover a surface (e.g., an upper surface that is opposite to the lower surface) and a sidewall (e.g., four sidewalls) of the semiconductor chip 10. For example, the capping insulation layer 20 may cover five surfaces of the semiconductor chip 10. A shielding layer 30 may be on the capping insulation layer 20. The shielding layer 30 may cover an upper surface and a sidewall or sidewalls of the capping insulation layer 20. The semiconductor package 100 may be a kind of fan-in wafer-level package.

Referring to FIGS. 3A and 4, the capping insulation layer 20 may include a laterally protruding capping protrusion 20p covering (or contacting, e.g., directly contacting) a lower surface of the shielding layer 30. The lower surface of the capping insulation layer 20 may be coplanar with a lower surface of the chip protection layer 14. The capping insulation layer 20 may have a first capping sidewall 20s1 over the capping protrusion 20p and a second capping sidewall 20s2 below the first capping sidewall 20s1. The second capping sidewall 20s2 may correspond to or be a sidewall of the capping protrusion 20p. A surface roughness of the second capping sidewall 20s2 may be greater than a surface roughness of the first capping sidewall 20s1. A lower portion of the shielding layer 30 may be closed or covered by the capping protrusion 20p, and when the semiconductor package 100 is mounted on a board substrate, undesirable contact between the shielding layer 30 and an adjacent conductive pattern may be blocked.

The capping insulation layer 20 may have a thickness of, e.g., about 1 μm to about 20 μm. The capping insulation layer 20 may include an inorganic layer, e.g., aluminum oxide layer, or silicon oxide layer, or a polymer-containing layer, e.g., epoxy or polyurethane, and may have a single or multilayered structure. When the capping insulation layer 20 is formed of an inorganic layer, e.g. aluminum oxide layer or a silicon oxide layer, the capping insulation layer 20 may be formed by a deposition process, e.g., a sputtering process, a physical vapor deposition (PVD), a chemical vapor deposition (CVD) process, or an atomic layer deposition (ALD) process. For example, when the capping insulation layer 20 is formed by an ALD process, the capping insulation layer 20 may be conformally formed to have a uniform thickness regardless of locations. In addition, when the capping insulation layer 20 is formed of a polymer-containing layer, the capping insulation layer 20 may be formed by a spray dry process.

In an implementation, referring to FIG. 4, the capping insulation layer 20 may include a polymer-containing layer 20a and insulating particles 20b dispersed in the polymer-containing layer 20a. The polymer-containing layer 20a may include, e.g., epoxy or polyurethane, and the insulating particles 20b may include and inorganic material, e.g., silicon oxide or aluminum oxide. The insulating particles 20b may be distributed in contact with each other in the polymer-containing layer 20a. The insulating particles 20b may be distributed in contact with each other, and the heat dissipation effect may be increased.

The silicon oxide layer or the aluminum oxide layer may have an insulation property and a relatively excellent heat conductivity. For example, when the capping insulation layer 20 is formed of silicon oxide or aluminum oxide or the insulating particles 20b are formed of silicon oxide or aluminum oxide, the heat dissipation effect may be increased.

In an implementation, referring again to FIG. 3A, the shielding layer 30 may have a thickness of, e.g., about 1 μm to about 10 μm. The shielding layer 30 may include a single or multilayered structure and may include metal, e.g., stainless steel (SUS), copper, or nickel. The shielding layer 30 may be formed by a deposition process, e.g., a sputtering process, a PVD process, a CVD process, or an ALD process. The shielding layer 30 may have a first shielding sidewall 30s1 adjacent to or roughly aligned with the sidewall of the semiconductor chip 10 and a second shielding sidewall 30s2 adjacent to or roughly aligned with a sidewall of the chip protection layer 14 and below the first shielding sidewall 30s1. A surface roughness of the second shielding sidewall 30s2 may be greater than a surface roughness of the first shielding sidewall 30s1. The second shielding sidewall 30s2 may be vertically aligned with the second capping sidewall 20s2.

In an implementation, referring to FIG. 3B, a lower portion of the shielding layer 30 may laterally protrude. For example, the shielding layer 30 may include a laterally protruding shielding protrusion 30p. The second shielding sidewall 30s2 of the shielding layer 30 may correspond to or be a sidewall of the shielding protrusion 30p.

In an implementation, referring to FIG. 3C, the shielding layer 30 may include a double layer of a first shielding layer 30a and a second shielding layer 30b. The first shielding layer 30a may include metal that is different from a metal of the second shielding layer 30b. The first shielding layer 30a may include a laterally protruding first shielding protrusion 30ap. In an implementation, the shielding layer 30 may have a triple or more layered structure. The shielding layer 30 of the double or multilayered structure may help increase an electromagnetic interference (EMI) shielding effect.

In an implementation, referring to FIG. 2B, a semiconductor package 100a may include an edge chip conductive pattern 12p on an edge (e.g., outer side) of the lower surface of the semiconductor chip 10. A sidewall of the edge chip conductive pattern 12p may be vertically aligned with the sidewall of the semiconductor chip 10 and the sidewall of the chip protection layer 14. The edge chip conductive pattern 12p may be insulated from the shielding layer 30 by the capping insulation layer 20. The other components of the semiconductor package 100a except the edge chip conductive pattern 12p may be the same or similar as described with reference to FIGS. 3A to 3C and 4.

Referring to FIGS. 2A and 2B, the semiconductor packages 100 and 100a may have the upper surfaces and the sidewalls protected by the capping insulation layer 20. The semiconductor package 100 and 100a may have the EMI shielding function by the shielding layer 30. The shielding layer 30 may be spaced apart from the edge chip conductive pattern 12p by the capping insulation layer 20, and a design freedom of the chip conductive patterns 12 and 12p may be increased. In an implementation, the capping insulation layer 20 may include, e.g., the aluminum oxide layer and/or the silicon oxide layer, and the heat dissipation effect may be increased. The capping insulation layer 20 may include the capping protrusion 20p contacting the lower surface of the shielding layer 30, and when the semiconductor packages 100 and 100a are mounted on the board substrate, the semiconductor packages 100 and 100a may be prevented from shorting with the adjacent conductive pattern. For example, a poor mounting may be prevented, and a semiconductor package with improved reliability and durability may be provided.

Figure 5A:
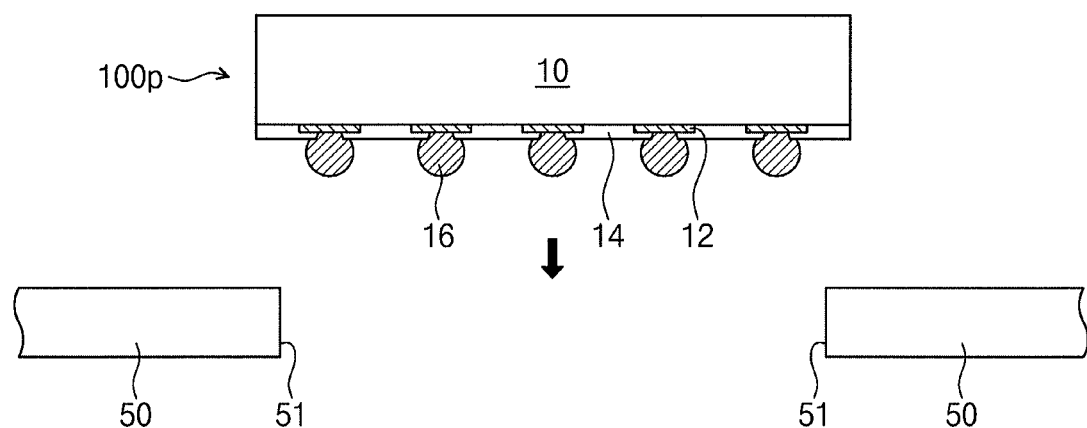
FIGS. 5A, 5B, and 5C illustrate cross-sectional views of stages in a method of manufacturing a semiconductor package having a cross section of FIG. 2A according to example embodiments.
Figure 5B:
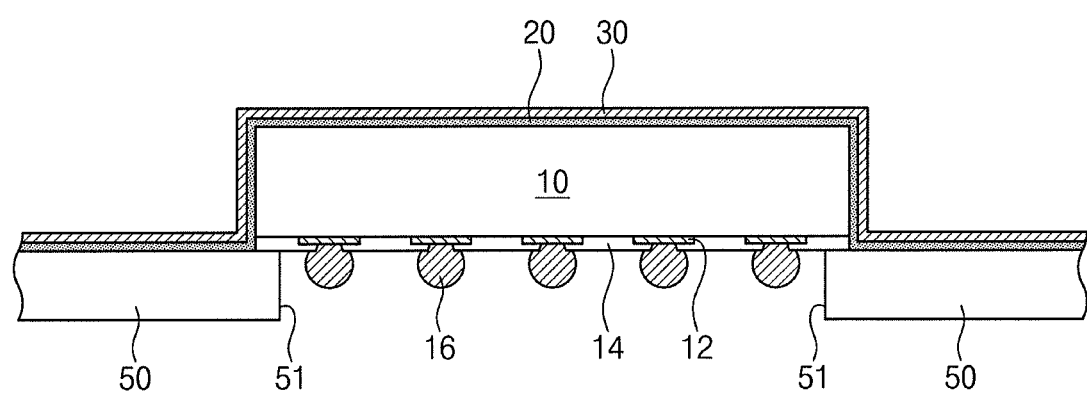
Figure 5C:
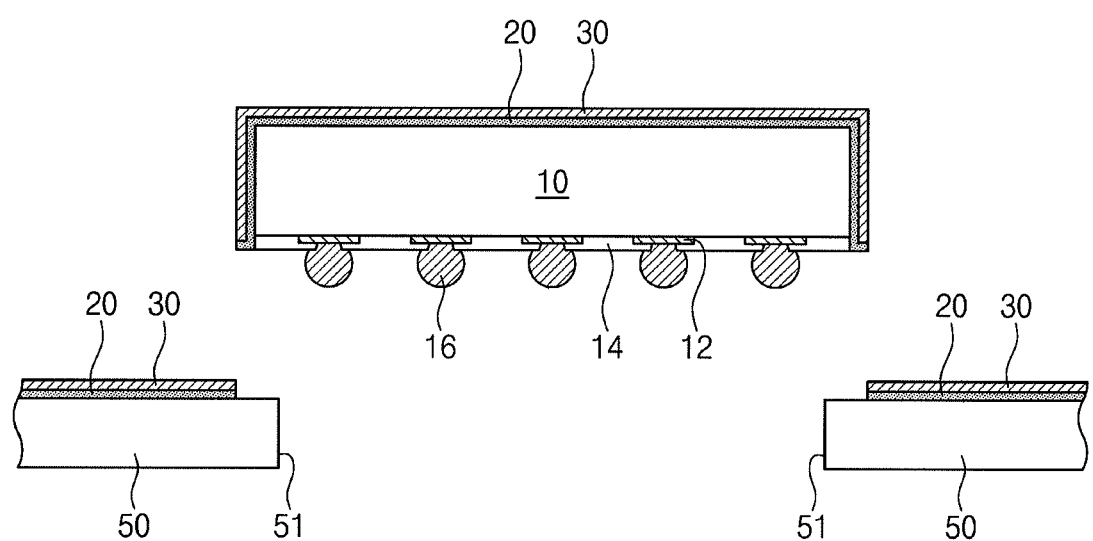

FIGS. 5A, 5B, and 5C illustrate cross-sectional views of stages in a method of manufacturing a semiconductor package having a cross section of FIG. 2A according to example embodiments.

Referring to FIG. 5A, a preliminary semiconductor package 100p may be manufactured. The preliminary semiconductor package 100p may have a structure excluding or without the capping insulation layer 20 and the shielding layer 30 in the semiconductor package 100 of FIG. 2A. The preliminary semiconductor package 100p may be formed by a manufacturing method of the fan-in wafer level package. A carrier substrate 50 may be prepared. The carrier substrate 50 may include an accommodating part 51. In an implementation, as illustrated in FIG. 5A, one accommodating part 51 may be included. In an implementation, a plurality of accommodating parts 51 may be arranged in the carrier substrate 50. The preliminary semiconductor package 100p may be located on the carrier substrate 50. At that time, the external connection terminals 16 attached to a lower surface of the semiconductor chip 10 may be inserted into the accommodating part 51 and an edge of the chip protection layer 14 may contact the carrier substrate 50.

Referring to FIG. 5B, the capping insulation layer 20 may be formed to cover an upper surface and sidewalls of the semiconductor chip 10. The capping insulation layer 20 may be continuously formed on an upper surface of the carrier substrate 50. The capping insulation layer 20 may be formed of an inorganic layer by performing a deposition process, e.g., a sputtering process, a PVD process, a CVD process, or an ALD process. In an implementation, the capping insulation layer 20 may be formed of a polymer-containing layer by a spray dry process. The shielding layer 30 may be formed on the capping insulation layer 20. The shielding layer 30 may be formed of a metal layer, e.g., SUS, copper, or nickel, by performing a deposition process, e.g., a sputtering process, a PVD process, a CVD process, or an ALD process. The shielding layer 30 may be formed on the upper surface of the carrier substrate 50 as well as the upper surface and the sidewalls of the semiconductor chip 10 (e.g., on the capping insulation layer 20).

Referring to FIG. 5C, the semiconductor chip 10 may be lifted from the carrier substrate 50. For example, the capping insulation layer 20 and the shielding layer 30 on the semiconductor chip 10 may be separated from the capping insulation layer 20 and the shielding layer 30 on the carrier substrate 50. The capping insulation layer 20 and the shielding layer 30 adjacent to a lower surface of the semiconductor chip 10 may laterally protrude similar to those shown in FIG. 3B. In an implementation, the protrusions (the capping protrusion 20p of FIG. 3B and the shielding protrusion 30p of FIG. 3B) may be polished, removing at least a portion of the protrusions. For example, the shielding protrusion 30p may be removed as shown in FIG. 3A, and a size of the capping protrusion 20p may be reduced. In an implementation, as shown in FIG. 3A or FIG. 3B, the surface roughness of the second capping sidewall 20s2 of the capping insulation layer 20 and the surface roughness of the second shielding sidewall 30s2 of the shielding layer 30 may be relatively increased. A resulting structure may become the structure shown in FIG. 3A or FIG. 3B depending on a polishing/removal amount of the shielding protrusion 30p and/or the capping protrusion 20p. In an implementation, before the semiconductor chip 10 is lifted from the carrier substrate 50, the capping insulation layer 20 and the shielding layer 30 may be cut off using a laser or a drill. The semiconductor package 100 of FIG. 2A may be manufactured through such processes.

Figure 6:
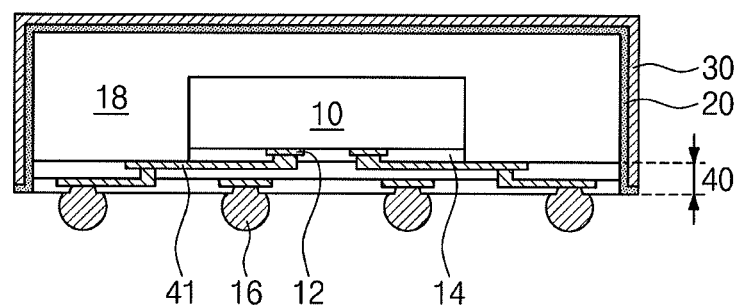
FIG. 6 illustrates a cross-sectional view of a semiconductor package according to example embodiments.

FIG. 6 illustrates a cross-sectional view of a semiconductor package according to example embodiments.

Referring to FIG. 6, a semiconductor package 101 may be an example of a fan-out wafer level package. For example, the semiconductor package 101 may have a chip-first or mold-first fan-out wafer-level package structure. The semiconductor package 101 may further include a redistribution layer 40 electrically connected to the semiconductor chip 10. Redistribution patterns 41 may be in the redistribution layer 40. Some of the redistribution patterns 41 may pass through the chip protection layer 14 to contact the chip conductive pattern 12 of the semiconductor chip 10. The redistribution patterns 41 may electrically connect the chip conductive pattern 12 of the semiconductor chip 10 and the external connection terminal 16.

The redistribution patterns 41 may include metal, e.g., copper or aluminum. The redistribution layer 40 may protrude outwardly from and below the sidewall of the semiconductor chip 10. A mold layer 18 may cover the redistribution layer 40 and the semiconductor chip 10. A lower surface (e.g., redistribution layer-facing surface) of the mold layer 18 may be coplanar with a lower surface of the chip protection layer 14. The mold layer 18 may include an insulating resin, e.g., an epoxy molding compound (EMC). The mold layer 18 may further include fillers. The fillers may be dispersed in the insulating resin. The fillers may include, e.g., silicon oxide.

An upper surface and a sidewall of the mold layer 18 and a sidewall of the redistribution layer 40 may be covered by the capping insulation layer 20. An upper surface and a sidewall of the capping insulation layer 20 may be covered by the shielding layer 30. A lower portion of the capping insulation layer 20 may laterally protrude and may contact a lower surface of the shielding layer 30. Detailed structures of the capping insulation layer 20 and the shielding layer 30 may be the same or similar as described with reference to FIGS. 3A to 3C and 4. In an implementation, in the semiconductor package 101, one semiconductor chip 10 may be on the redistribution layer 40. In an implementation, two or more semiconductor chips 10 may be side by side on the redistribution layer 40.

The semiconductor package 101 may be manufactured as follows. The semiconductor chip 10 may be on an extra carrier substrate and then the mold layer 18 may be formed to cover the semiconductor chip 10. After the semiconductor chip 10 and the mold layer 18 are separated from the extra carrier substrate, the redistribution layer 40 may be formed on a lower surface of the semiconductor chip 10 and the lower surface of the mold layer 18 to manufacture a preliminary semiconductor package. The preliminary semiconductor package may be located on the carrier substrate 50, instead of the preliminary semiconductor package 100p of FIG. 5A. Thereafter, the subsequent processes as described with reference to FIGS. 5B and 5C may be performed to form the capping insulation layer 20 and the shielding layer 30.

Figure 7:
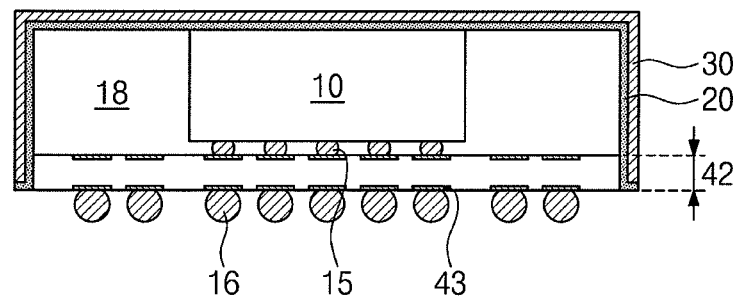
FIG. 7 illustrates a cross-sectional view of a semiconductor package according to example embodiments.

FIG. 7 illustrates a cross-sectional view of a semiconductor package according to example embodiments.

Referring to FIG. 7, a semiconductor package 102 may include a package substrate 42. The semiconductor chip 10 may be mounted on the package substrate 42 by a flip chip bonding method using an internal connector 15. The package substrate 42 may be a printed circuit board (PCB) substrate having a single or multilayered wiring structure.

The internal connector 15 may include, e.g., a conductive bump, a conductive pillar, a solder layer, or a solder ball. The conductive bump and the conductive pillar may include, e.g., copper. The solder layer and the solder ball may include, e.g., tin or lead. A ball land 43 may be on a lower surface of the package substrate 42. The external connection terminal 16 may be bonded to the ball land 43. The package substrate 42 may protrude outwardly from and below a sidewall of the semiconductor chip 10. The mold layer 18 may cover the sidewall of the semiconductor chip 10 and an upper surface of the package substrate 42. An upper surface of the mold layer 18 may be coplanar with an upper surface of the semiconductor chip 10. The mold layer 18 may extend to fill a space between the semiconductor chip 10 and the package substrate 42.

The capping insulation layer 20 may contact the upper surface of the semiconductor chip 10, the upper surface and a sidewall of the mold layer 18, and the sidewall of the package substrate 42. An upper surface and a sidewall of the capping insulation layer 20 may be covered by the shielding layer 30. A lower portion of the capping insulation layer 20 may laterally protrude to contact a lower surface of the shielding layer 30. Detailed structures of the capping insulation layer 20 and the shielding layer 30 may be the same or similar as described with reference to FIGS. 3A to 3C and 4. In an implementation, in the semiconductor package 102, one semiconductor chip 10 may be on the package substrate 42. In an implementation, two or more semiconductor chips 10 may be disposed side by side or vertically stacked on the package substrate 42.

The semiconductor package 102 may be manufactured as follows. After a preliminary semiconductor package of a structure except or not including the capping insulation layer 20 and the shielding layer 30 in the structure of FIG. 7 is manufactured, the preliminary semiconductor package may be located on the carrier substrate 50, instead of the preliminary semiconductor package 100p of FIG. 5A. Thereafter, the subsequent processes as described with reference to FIGS. 5B and 5C may be performed.

Figure 8:
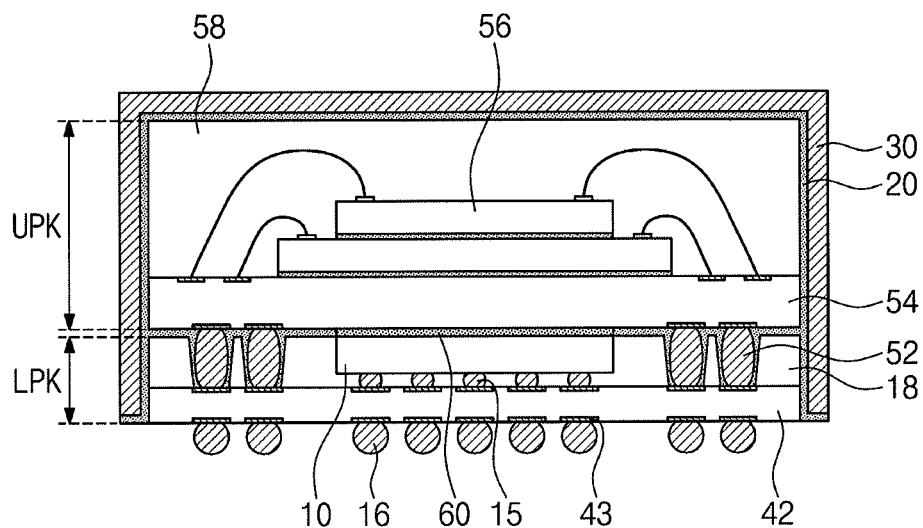
FIG. 8 illustrates a cross-sectional view of a semiconductor package according to example embodiments.

FIG. 8 illustrates a cross-sectional view of a semiconductor package according to example embodiments.

Referring to FIG. 8, a semiconductor package 103 may be an example of a package on package structure. The semiconductor package 103 may include a lower semiconductor package LPK and an upper semiconductor package UPK mounted on the lower semiconductor package LPK.

The lower semiconductor package LPK may include a lower package substrate 42 and a lower semiconductor chip 10 mounted on the lower package substrate 42. The lower package substrate 42 may be a PCB substrate having a single or multilayered wiring structure. The lower semiconductor chip 10 may be mounted on the lower package substrate 42 by a flip chip bonding method using the internal connector 15. The external connection terminal 16 may be adhered to the lower package substrate 42. The internal connector 15 and the external connection terminal 16 may each include, e.g., a conductive bump, a conductive pillar, a solder layer, or a solder ball. A lower mold layer 18 may cover an upper surface of the lower package substrate 42 and the lower semiconductor chip 10. An upper surface of the lower mold layer 18 may be coplanar with an upper surface of the lower semiconductor chip 10.

The upper semiconductor package UPK may include an upper package substrate 54 and upper semiconductor chips 56 mounted on the upper package substrate 54. The upper semiconductor chips 56 may be stacked on the upper package substrate 54 and may be connected to the upper package substrate 54 by a wiring bonding method. The upper semiconductor chips 56 and the upper package substrate 54 may be covered by an upper mold layer 58. The lower mold layer 18 and the upper mold layer 58 may each include an insulating resin, e.g., an epoxy molding compound (EMC). The lower mold layer 18 and the upper mold layer 58 may further include fillers. The fillers may be dispersed in the insulating resin. The fillers may include, e.g., silicon oxide.

The upper semiconductor package UPK may be electrically connected to the lower semiconductor package LPK by a package connector 52. The package connector 52 may electrically connect the lower package substrate 42 and the upper package substrate 54. The lower mold layer 18 may include an opening into which the package connector 52 is inserted. The package connector 52 may include, e.g., a conductive bump, a conductive pillar, a solder layer, or a solder bump.

The upper package substrate 54 may be spaced apart from the lower semiconductor chip 10 and the lower mold layer 18. A thermal interface material layer 60 may be between the upper package substrate 54 and the lower semiconductor chip 10. The thermal interface material layer 60 may include, e.g., thermal grease or thermal epoxy. In an implementation, the thermal grease or the thermal epoxy may include metal solid particles.

The upper semiconductor package UPK and the lower semiconductor package LPK may be covered by the capping insulation layer 20. The capping insulation layer 20 may contact an upper surface and a sidewall of the upper mold layer 58, a sidewall of the upper package substrate 54, a sidewall of the lower mold layer 18, and a sidewall of the lower package substrate 42. The capping insulation layer 20 may extend between the lower mold layer 18 and the upper package substrate 54. The capping insulation layer 20 may extend to contact a sidewall of the package connector 52 and the thermal interface material layer 60.

An upper surface and a sidewall of the capping insulation layer 20 may be covered by the shielding layer 30. A lower portion of the capping insulation layer 20 may laterally protrude to contact a lower surface of the shielding layer 30. Detailed structures of the capping insulation layer 20 and the shielding layer 30 may be the same or similar as described with reference to FIGS. 3A to 3C and 4.

The semiconductor package 103 may be manufactured as follows. After a preliminary semiconductor package having a structure except the capping insulation layer 20 and the shielding layer 30 in the structure of FIG. 8 is manufactured, the preliminary semiconductor package may be located on the carrier substrate 50, instead of the preliminary semiconductor package 100p of FIG. 5A. Thereafter, the subsequent processes as described with reference to FIGS. 5B and 5C may be performed. The capping insulation layer 20 may be conformally formed by an ALD process. At that time, a source gas for forming the capping insulation layer 20 may be diffused between the upper semiconductor package UPK and the lower semiconductor package LPK, such that the capping insulation layer 20 may fill a space between the upper semiconductor package UPK and the lower semiconductor package LPK.

Figure 9:
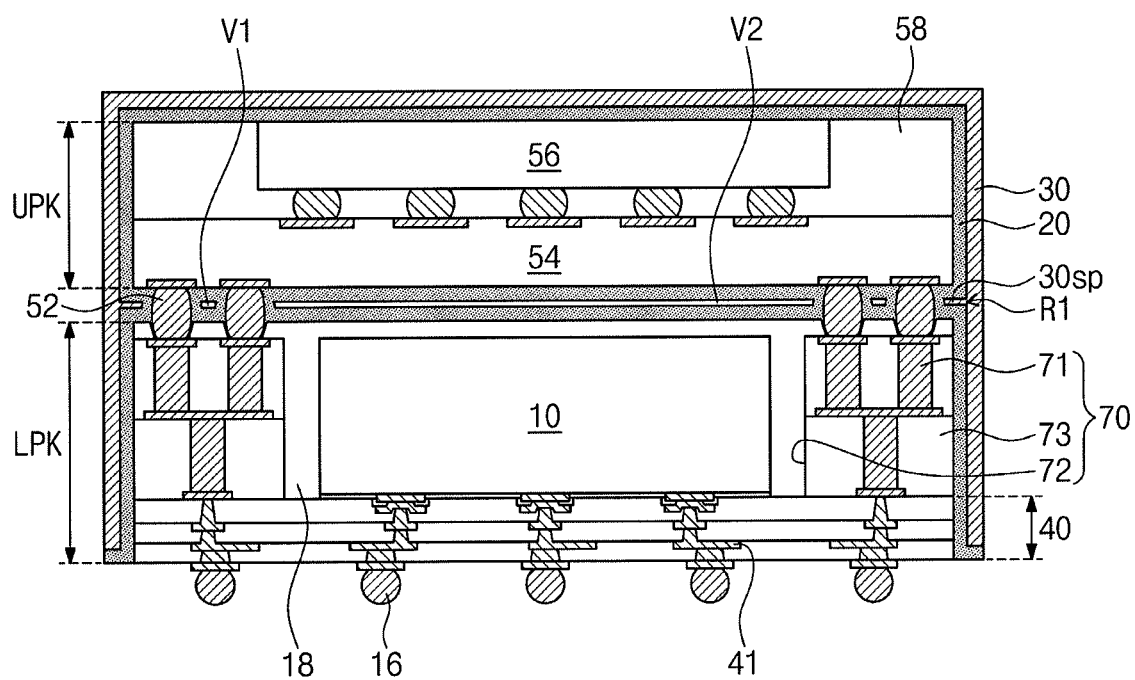
FIG. 9 illustrates a cross-sectional view of a semiconductor package according to example embodiments.

FIG. 9 illustrates a cross-sectional view of a semiconductor package according to example embodiments.

Referring to FIG. 9, a semiconductor package 104 may be an example of a package on package structure. The semiconductor package 104 may include the lower semiconductor package LPK and the upper semiconductor package UPK mounted on the lower semiconductor package LPK.

The lower semiconductor package LPK may include the redistribution layer 40 and the semiconductor chip 10 mounted on the redistribution layer 40. A connection substrate 70 including a cavity 72 may be on the redistribution layer 40. In an implementation, the cavity 72 may be in a central portion in the connection substrate 70, and the connection substrate 70 may have a rectangular loop shape in plan view. The connection substrate 70 may include connection wiring structures 71 and connection insulation layers 73. The connection wiring structures 71 may include conductive via plugs passing through the connection insulation layers 73, conductive wiring lines, and conductive pads. The connection insulation layers 73 may each include a thermoset resin, e.g. epoxy resin, a thermoplastic resin, e.g., polyimide, or a resin having a reinforcing material, e.g., a glass fiber (glass cloth or glass fabric) or an inorganic filler impregnated in the thermosetting resin and the thermoplastic resin, such as prepreg, an ajinomoto build-up film (BF), bismaleimide triazine (BT), or a photo imageable dielectric (PLD) resin.

The connection wiring structures 71 may be electrically connected to the redistribution patterns 41 in the redistribution layer 40. The lower semiconductor chip 10 may be inserted into the cavity 72. The lower semiconductor chip 10 may be spaced apart from an inner sidewall of the cavity 72. The lower mold layer 18 may fill a space between the lower semiconductor chip 10 and the inner sidewall of the cavity 72. The lower mold layer 18 may contact an upper surface of the redistribution layer 40. The lower mold layer 18 may extend to cover an upper surface of the lower semiconductor chip 10. The lower mold layer 18 may also extend to cover an upper surface of the connection substrate 70. A sidewall of the lower mold layer 18 may be vertically aligned with a sidewall of the connection substrate 70 and a sidewall of the redistribution layer 40.

The upper semiconductor package UPK may include the upper package substrate 54 and the upper semiconductor chip 56 mounted on the upper package substrate 54. The upper semiconductor chip 56 may be mounted on the upper package substrate 54 by a flip chip bonding method. The upper mold layer 58 may cover an upper surface of the upper package substrate 54 and a sidewall of the upper semiconductor chip 56. The upper mold layer 58 may fill a space between the upper semiconductor chip 56 and the upper package substrate 54. An upper surface of the upper mold layer 58 may be coplanar with an upper surface of the upper semiconductor chip 56.

The upper semiconductor package UPK may be spaced apart from the lower semiconductor package LPK. The upper semiconductor package UPK may be electrically connected to the lower semiconductor package LPK by the package connectors 52. The package connectors 52 may electrically connect the connection substrate 70 and the upper package substrate 54. The lower mold layer 18 may include openings into which the package connectors 52 are inserted. The package connectors 52 may each include, e.g., a conductive bump, a conductive pillar, a solder layer, or a solder ball.

The upper semiconductor package UPK and the lower semiconductor package LPK may be covered by the capping insulation layer 20. The capping insulation layer 20 may contact the upper surface and the sidewall of the upper mold layer 58, an upper surface of the upper semiconductor chip 56, a sidewall of the upper package substrate 54, the sidewall of the lower mold layer 18, the sidewall of the connection substrate 70, and the sidewall of the redistribution layer 40.

The capping insulation layer 20 may extend between the lower mold layer 18 and the upper package substrate 54. The capping insulation layer 20 may extend to contact sidewalls of the package connectors 52. The capping insulation layer 20 may have a constant thickness regardless of locations. A first air gap region V1 and a second air gap region V2 may be present in the capping insulation layer 20. The first air gap region V1 may be present between the connection substrate 70 and the upper package substrate 54 or between the adjacent package connectors 52. The second air gap region V2 may be present between the lower semiconductor chip 10 and the upper package substrate 54. A recess region R1 may be in the capping insulation layer 20 between an edge of the upper semiconductor package UPK and an edge of the lower semiconductor package LPK.

The shielding layer 30 may cover an upper surface and a sidewall of the capping insulation layer 20. The shielding layer 30 may include a middle shielding protrusion 30sp filling the recess region R1. A lower portion of the capping insulation layer 20 may laterally protrude to contact a lower surface of the shielding layer 30. Detailed structures of the capping insulation layer 20 and the shielding layer 30 may be the same or similar as described with reference to FIGS. 3A to 3B and 4.

The semiconductor package 104 may be manufactured as follows. After a preliminary semiconductor package having a structure except the capping insulation layer 20 and the shielding layer 30 in the structure of FIG. 9 is manufactured, the preliminary semiconductor package may be located on the carrier substrate 50, instead of the preliminary semiconductor package 100p of FIG. 5A. Thereafter, the subsequent processes as described with reference to FIGS. 5B and 5C may be performed. The capping insulation layer 20 may be conformally formed by an ALD process. At that time, a source gas for forming the capping insulation layer 20 may be diffused between the upper semiconductor package UPK and the lower semiconductor package LPK, such that the capping insulation layer 20 may be interposed between the upper semiconductor package UPK and the lower semiconductor package LPK. In addition, at that time, the first air gap region V1 and the second air gap region V2 may be formed.

Figure 10:
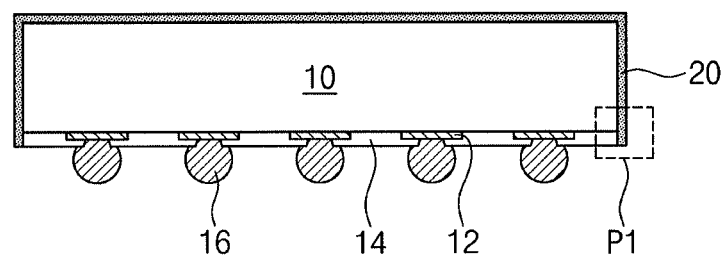
FIG. 10 illustrates a cross-sectional view of a semiconductor package according to example embodiments.
Figure 11:
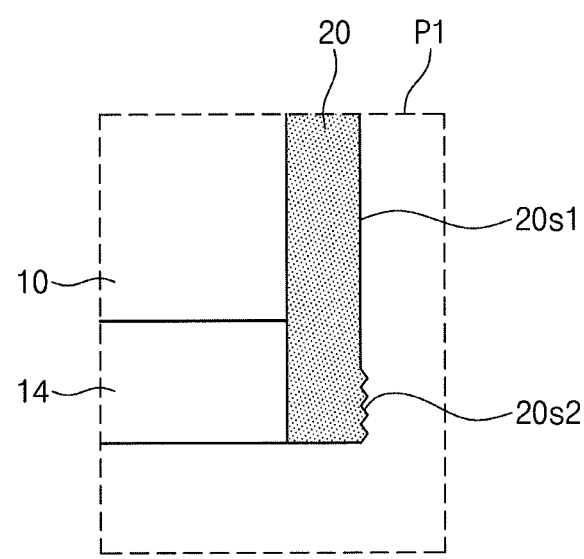
FIG. 11 illustrates an enlarged view of portion P1' of FIG. 10.

FIG. 10 illustrates a cross-sectional view of a semiconductor package according to example embodiments. FIG. 11 illustrates an enlarged view of portion 'P1' of FIG. 10.

Referring to FIGS. 10 and 11, in a semiconductor package 105, the shielding layer 30 of FIG. 2A may be omitted. An upper surface and a sidewall of the semiconductor chip 10 may be covered by only the capping insulation layer 20. For example, the capping protrusion 20p of FIG. 2A may not be present at a lower portion of the capping insulation layer 20. The capping insulation layer 20 may include the first capping sidewall 20s1 and a second capping sidewall 20s2 below the first capping sidewall 20s1. A surface roughness of the second capping sidewall 20s2 may be greater than a surface roughness of the first capping sidewall 20s1. Such a structure of the semiconductor package excluding the shielding layer 30 may be applied to the semiconductor packages 101, 102, 103, and 104 of FIGS. 6 to 9. For example, the semiconductor packages 101, 102, 103, and 104 of FIGS. 6 to 9 may not include the shielding layer 30. In this case, the capping insulation layer 20 may not include the capping protrusion 20p of FIG. 2A and a lower structure of the capping insulation layer 20 may be the same or similar as described with reference to FIG. 11.

The semiconductor package 105 may be manufactured by performing the same processes as described with reference to FIG. 5A to 5C except omitting forming of the shielding layer 30 of FIG. 5C.

Figure 12:
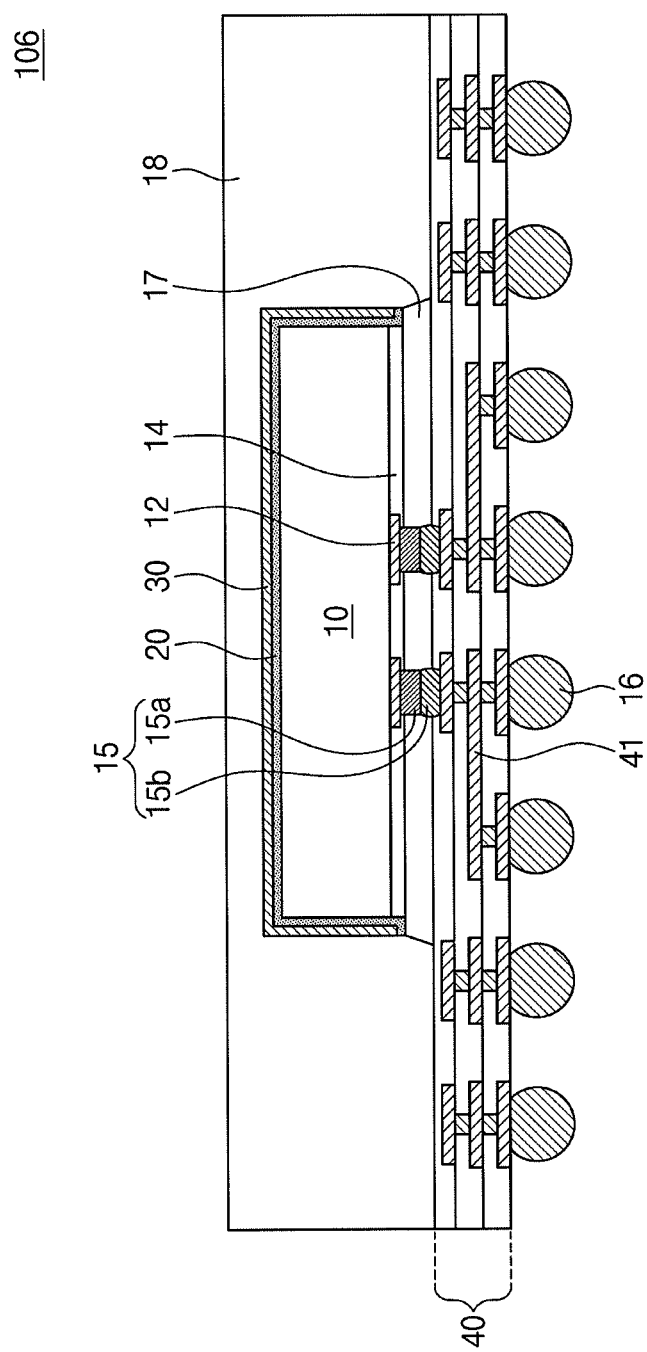
FIG. 12 illustrates a cross-sectional view of a semiconductor package according to example embodiments.

FIG. 12 illustrates a cross-sectional view of a semiconductor package according to example embodiments.

Referring to FIG. 12, a semiconductor package 106 may have a chip-last or redistribution (RDL)-first fan-out wafer-level package structure. For example, the semiconductor chip 10 may be on the redistribution layer 40. An upper surface and sidewalls of the semiconductor chip 10 may be sequentially covered by the capping insulation layer 20 and the shielding layer 30. The capping insulation layer 20 and the shielding layer 30 may be the same or similar as described with reference to FIGS. 1 to 4.

Multilayer redistribution patterns 41 may be in the redistribution layer 40. Some of the redistribution patterns 41 may electrically connect the external connection terminals 16 and the internal connectors 15 contacting the chip conductive patterns 12. Each of the internal connectors 15 may include a conductive pillar 15a and a solder layer 15b below the conductive pillar 15a. The conductive pillar 15a may include, e.g., copper. The solder layer 15b may include, e.g., tin and/or lead. The structure in which the internal connector 15 includes the conductive pillar 15a and the solder layer 15b may be advantageous in preventing the electrical short, as an interval between the internal connectors 15 is narrower. The redistribution layer 40 may extend outwardly from and below a sidewall of the semiconductor chip 10.

A space between the semiconductor chip 10 and the redistribution layer 40 may be filled with an underfill layer 17. The underfill layer 17 may contact the capping insulation layer 20, and may be spaced apart from the shielding layer 30. The shielding layer 30 and the redistribution layer 40 may be covered by the mold layer 18. The mold layer 18 may contact a lower sidewall (e.g., a sidewall of the capping protrusion) of the capping insulation layer 20. A lower surface of the mold layer 18 may be lower than a lower surface of the semiconductor chip 10 and a lower surface of the chip protection layer 14 with respect to an upper surface of the redistribution layer 40. The mold layer 18 may contact the underfill layer 17. The other components of the semiconductor package 106 may be the same or similar as described with reference to FIG. 6.

The semiconductor package 106 may be manufactured as follows. The semiconductor chip 10 may be provided to be covered by the capping insulation layer 20 and the shielding layer 30 through the processes described with reference to FIGS. 5A, 5B, and 5C. The redistribution layer 40 may be formed on an extra carrier substrate, and the semiconductor chip 10 may be mounted on the redistribution layer 40. Thereafter, the underfill layer 17 and the mold layer 18 may be formed.

Figure 13:
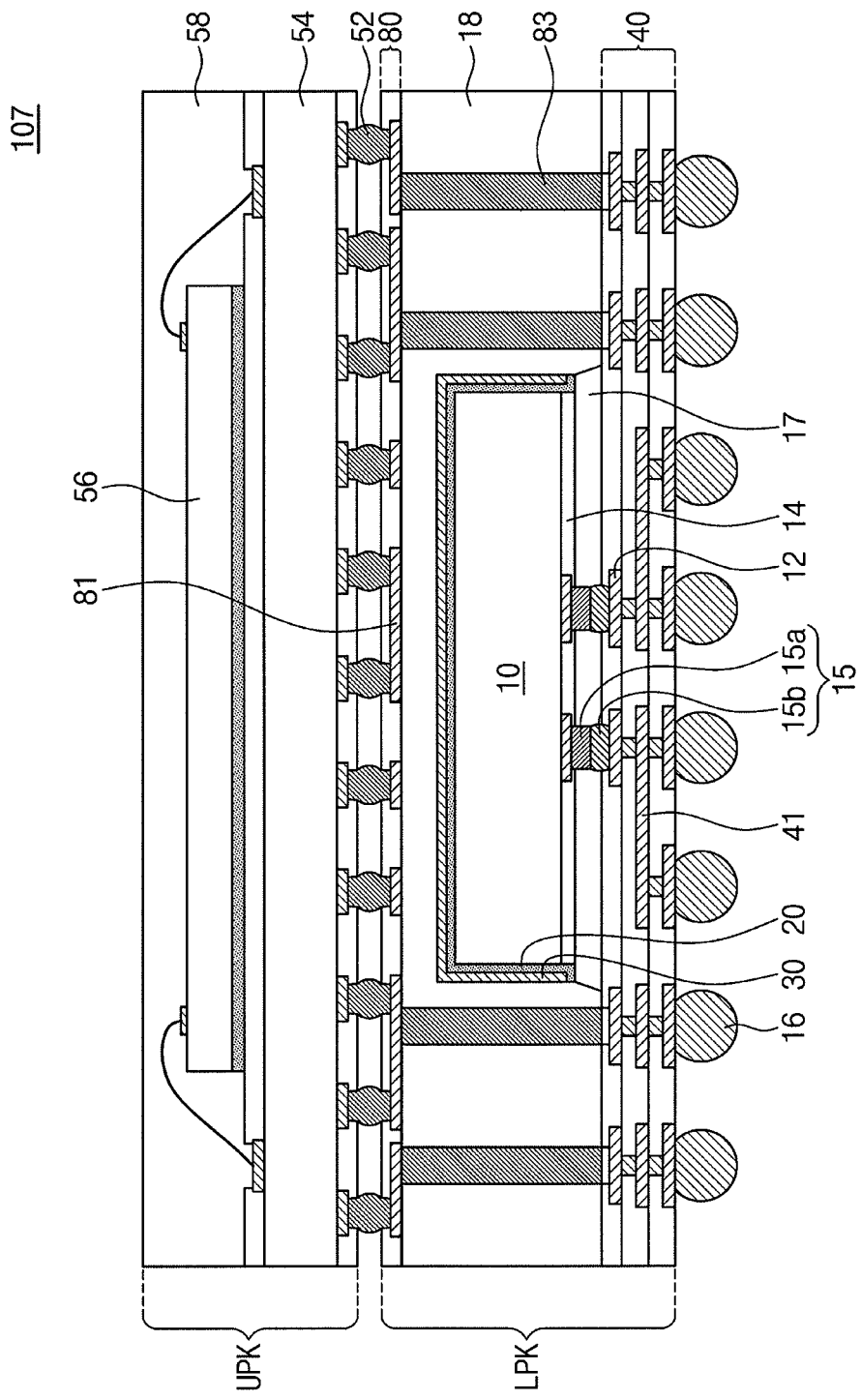
FIG. 13 illustrates a cross-sectional view of a semiconductor package according to example embodiments.

FIG. 13 illustrates a cross-sectional view of a semiconductor package according to example embodiments.

Referring to FIG. 13, a semiconductor package 107 may be an example of a package on package structure. The semiconductor package 107 may include the lower semiconductor package LPK and the upper semiconductor package UPK mounted on the lower semiconductor package LPK.

The lower semiconductor package LPK may have a similar structure as the semiconductor package 106 of FIG. 12. For example, the lower semiconductor package LPK may include the lower semiconductor chip 10 mounted on a lower redistribution layer 40. The lower redistribution layer 40 may include lower redistribution patterns 41. An upper surface and sidewalls of the lower semiconductor chip 10 may be covered by the capping insulation layer 20 and the shielding layer 30. The shielding layer 30 and the lower redistribution layer 40 may be covered by the lower mold layer 18. An upper redistribution layer 80 may be on the lower mold layer 18. The upper redistribution layer 80 may include upper redistribution patterns 81. A through-via 83 may pass through the lower mold layer 18 to electrically connect the upper redistribution layer 80 and the lower redistribution layer 40.

The upper semiconductor package UPK may include the upper package substrate 54 and the upper semiconductor chip 56 mounted on the upper package substrate 54. The upper semiconductor chip 56 may be connected to the upper package substrate 54 by a wire bonding method. The upper semiconductor chip 56 and the upper package substrate 54 may be covered by the upper mold layer 58. The upper semiconductor package UPK may be electrically connected to the lower semiconductor package LPK by the package connector 52. For example, the package connector 52 may electrically connect the upper redistribution layer 80 and the upper package substrate 54. The upper mold layer 58 and the lower mold layer 18 may not be covered by the capping insulation layer 20 and the shielding layer 30, and may be exposed. The other components of the semiconductor package 107 may be the same or similar as described with reference to FIGS. 8 and 12.

By way of summation and review, with development of the electronic industry, various studies have been conducted to improve reliability and durability of the semiconductor package.

One or more embodiments may provide a semiconductor package that helps prevent shorting with an adjacent semiconductor package, and thus a poor mounting may be prevented, providing a semiconductor package with improved reliability and durability.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
a package substrate including a first surface and a second surface facing each other;
a semiconductor chip on the first surface of the package substrate;
a capping insulation layer covering an upper surface and a side surface of the semiconductor chip;
a shielding layer covering an upper surface and a side surface of the capping insulation layer;
a mold layer covering an upper surface and a side surface of the shielding layer; and
a plurality of external connection terminals provided on the second surface of the package substrate,
wherein:
the package substrate includes a first region that vertically overlaps with the semiconductor chip and a second region that surrounds the first region,
at least some of the external connection terminals are provided on the second region of the package substrate,
the capping insulation layer is in contact with the upper surface and the side surface of the semiconductor chip,
the shielding layer is in contact with the upper surface and the side surface of the capping insulation layer,
the capping insulation layer includes a polymer-containing layer and insulating particles dispersed therein,
the shielding layer includes at least one metal layer, and
a thickness of the mold layer is greater than a thickness of the capping insulation layer.

2. The semiconductor package as claimed in claim 1, wherein the package substrate includes a redistribution layer or a printed circuit board (PCB).

3. The semiconductor package as claimed in claim 1, wherein the capping insulation layer has a thickness of 1 µm to 20 µm.

4. The semiconductor package as claimed in claim 1, wherein the shielding layer has a thickness of 1 µm to 10 µm.

5. The semiconductor package as claimed in claim 1, further comprising:
chip conductive patterns on a lower surface of the semiconductor chip; and
a chip protection layer covering the lower surface of the semiconductor chip and exposing the chip conductive patterns,
wherein the capping insulation layer is in contact with a side surface of the chip protection layer.

6. The semiconductor package as claimed in claim 5, further comprising internal connectors between the chip conductive patterns and the package substrate,
wherein:
each of the internal connectors includes conductive pillars and a solder layer disposed thereunder, and
the conductive pillars and the solder layer include different metal materials.

7. The semiconductor package as claimed in claim 1, wherein the package substrate protrudes outwardly relative to a sidewall of the semiconductor chip.

8. The semiconductor package as claimed in claim 1, wherein the mold layer is in contact with a lower portion of the capping insulation layer.

9. The semiconductor package as claimed in claim 1, wherein:
the polymer-containing layer includes an epoxy or polyurethane, and
the insulating particles include a silicon oxide or an aluminum oxide.

10. The semiconductor package as claimed in claim 1, wherein the shielding layer includes stainless steel (SUS), copper, or nickel.

11. The semiconductor package as claimed in claim 1, wherein the capping insulation layer and the shielding layer are spaced apart from the package substrate.

12. A semiconductor package, comprising:
a lower semiconductor package; and
an upper semiconductor package on the lower semiconductor package;
wherein the lower semiconductor package includes:
a lower redistribution layer,
a lower semiconductor chip on the lower redistribution layer,
a capping insulation layer covering an upper surface and a side surface of the lower semiconductor chip,
a shielding layer covering an upper surface and a side surface of the capping insulation layer,
a lower mold layer covering an upper surface and a side surface of the shielding layer,
an upper redistribution layer on the lower mold layer, and
through-vias penetrating the lower mold layer and connecting the lower redistribution layer and the upper redistribution layer,
wherein the upper semiconductor package includes:
an upper package substrate,
an upper semiconductor chip on the upper package substrate, and
an upper mold layer covering the upper package substrate and the upper semiconductor chip,
wherein the capping insulation layer and the lower mold layer include an insulating material, and the shielding layer includes a metal material,
wherein the capping insulation layer and the shielding layer are spaced apart from the lower redistribution layer, and
wherein the lower mold layer is in contact with the lower redistribution layer.

13. The semiconductor package as claimed in claim 12, wherein:
the capping insulation layer has a thickness of 1 µm to 20 µm, and
the shielding layer has a thickness of 1 µm to 10 µm.

14. The semiconductor package as claimed in claim 12, wherein a lowermost portion of the capping insulation layer is positioned below a lowermost portion of the shielding layer.

15. The semiconductor package as claimed in claim 12, wherein the lower redistribution layer protrudes outwardly relative to a sidewall of the lower semiconductor chip.

16. The semiconductor package as claimed in claim 12, wherein the capping insulation layer and the shielding layer are spaced apart from the upper redistribution layer.

17. The semiconductor package as claimed in claim 12, further comprising:
internal connectors between the lower redistribution layer and the lower semiconductor chip; and
an underfill layer filling between the internal connectors, wherein the underfill layer is in contact with the capping insulation layer.

18. A semiconductor package, comprising:
a package substrate including a first surface and a second surface facing each other;

a semiconductor chip on the first surface of the package substrate;
a capping insulation layer covering an upper surface and a side surface of the semiconductor chip;
a shielding layer covering an upper surface and a side surface of the capping insulation layer;
a mold layer covering an upper surface and a side surface of the shielding layer; and
a plurality of external connection terminals provided on the second surface of the package substrate,
wherein:
the package substrate includes a first region that vertically overlaps with the semiconductor chip and a second region that surrounds the first region,
at least some of the external connection terminals are provided on the second region of the package substrate,
the capping insulation layer has a thickness of 1 μm to 20 μm,
the shielding layer has a thickness of 1 μm to 10 μm,
the capping insulation layer includes a polymer-containing layer and insulating particles dispersed therein,
the shielding layer includes at least one metal layer,
the polymer-containing layer includes epoxy or polyurethane,
the insulating particles include silicon oxide or aluminum oxide, and
the metal layer includes stainless steel (SUS), copper, or nickel.

19. The semiconductor package as claimed in claim 18, further comprising:
internal connectors interposed between the package substrate and the semiconductor chip; and
an underfill layer filling between the internal connectors,
wherein the capping insulation layer and the shielding layer are spaced apart from the package substrate with the underfill layer therebetween.

20. The semiconductor package as claimed in claim 19, wherein the underfill layer and the capping insulation layer include different insulating materials.

* * * * *